United States Patent
Miller et al.

(10) Patent No.: US 6,358,837 B1
(45) Date of Patent: *Mar. 19, 2002

(54) METHOD OF ELECTRICALLY CONNECTING AND ISOLATING COMPONENTS WITH VERTICAL ELEMENTS EXTENDING BETWEEN INTERCONNECT LAYERS IN AN INTEGRATED CIRCUIT

(75) Inventors: Gayle W. Miller; Kenneth P. Fuchs, both of Colorado Springs, CO (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/052,793

(22) Filed: Mar. 31, 1998

(51) Int. Cl.⁷ ............... H01L 21/8242; H01L 21/4763; H01L 21/461

(52) U.S. Cl. .............. 438/622; 438/244; 438/637; 438/692

(58) Field of Search ............... 438/243, 244, 438/691, 692, 706, 712, 633, 629, 637, 622, 643, 653; 257/301

(56) References Cited

U.S. PATENT DOCUMENTS

| | | | | |
|---|---|---|---|---|
| 4,912,535 A | * | 3/1990 | Okumura .................. 357/23.6 |
| 5,095,346 A | | 3/1992 | Bae et al. ................. 357/23.6 |
| 5,101,251 A | * | 3/1992 | Wakamiya et al. ....... 357/23.06 |
| 5,155,657 A | | 10/1992 | Oehrlein et al. ............ 361/313 |
| 5,240,871 A | | 8/1993 | Doan et al. ................ 438/397 |
| 5,273,925 A | | 12/1993 | Yamanaka .................. 437/52 |
| 5,381,365 A | | 1/1995 | Ajika et al. ................ 365/149 |
| 5,394,000 A | | 2/1995 | Ellul et al. ................. 257/301 |
| 5,434,812 A | | 7/1995 | Tseng ....................... 365/149 |
| 5,436,186 A | | 7/1995 | Hsue et al. ................. 438/397 |
| 5,451,551 A | | 9/1995 | Krishnan et al. ............ 438/626 |
| 5,494,854 A | | 2/1996 | Jain .......................... 437/195 |
| 5,494,857 A | | 2/1996 | Cooperman et al. ......... 437/228 |
| 5,497,017 A | | 3/1996 | Gonzales .................... 257/306 |
| 5,605,857 A | * | 2/1997 | Jost et al. .................... 437/60 |
| 5,702,990 A | * | 12/1997 | Jost et al. ................... 438/618 |
| 5,708,303 A | | 1/1998 | Jeng .......................... 257/758 |
| 5,736,457 A | | 4/1998 | Zhao ......................... 438/624 |
| 5,747,382 A | * | 5/1998 | Huang et al. ............... 438/624 |
| 5,753,948 A | | 5/1998 | Nguyen et al. ............. 257/307 |
| 5,767,541 A | | 6/1998 | Hanagasaki ................ 257/295 |
| 5,846,876 A | | 12/1998 | Bandyopadhyay et al. . 438/622 |
| 5,913,141 A | * | 6/1999 | Bothra ....................... 438/625 |
| 5,915,203 A | * | 6/1999 | Sengupta et al. ........... 438/669 |
| 5,925,932 A | * | 7/1999 | Tran et al. .................. 257/750 |
| 5,981,374 A | * | 11/1999 | Dalal et al. ................. 438/624 |

OTHER PUBLICATIONS

Arjun Kar–Roy, et al., High Density Metal Insulator Metal Capacitors Using PECVD Nitride for Mixed Signal and RF Circuits, 1999, IEEE, pp. 245–247.

* cited by examiner

Primary Examiner—John F. Niebling
Assistant Examiner—Ha Tran Nguyen

(57) ABSTRACT

A vertically oriented metal circuit element is electrically connected and isolated between vertically separated conductors of interconnect layers in an integrated circuit. The methodology involves connecting a lower end of the metal element to the lower interconnect layer at the lower end of an opening in an inter-layer dielectric, preferably by simultaneously forming the metal element and connecting it to the conductor by vapor deposition. An upper end of the metal element initially extends above an upper surface of the inter-layer dielectric, and chemical mechanical polishing is employed to reduce the upper end to a level flush with the upper surface of the inter-layer dielectric. The flush upper end of the metal element allows it to be precisely spaced and covered with dielectric material to obtain predictable and reliable electrical isolation characteristics. The electrical connection and isolation is obtained with a minimum of space to allow the metal element to the effectively positioned vertically between the interconnect layers.

19 Claims, 3 Drawing Sheets

METHOD OF ELECTRICALLY CONNECTING AND ISOLATING COMPONENTS WITH VERTICAL ELEMENTS EXTENDING BETWEEN INTERCONNECT LAYERS IN AN INTEGRATED CIRCUIT

CROSS-REFERENCE TO RELATED INVENTION

This invention is related to the invention for a "High Aspect Ratio, Metal-to-Metal, Linear Capacitor for an Integrated Circuit," described in a concurrently filed U.S. patent application Ser. No. 09/052,851 which is assigned to the assignee hereof. The subject matter of this application is incorporated herein by this reference.

This invention relates to processes used to fabricate integrated circuits (ICs). More particularly, the present invention relates to a new and improved method of fabricating electrical connections and isolations between vertical circuit components, such as capacitor plates, and electrical conductors of interconnect layers of the IC, whereby the amount of space consumed by the connection or isolation is minimized, the number of process steps is minimized, and the process steps used are compatible with other process steps used to fabricate the IC.

BACKGROUND OF THE INVENTION

Recent efforts in miniaturizing ICs have focused on reducing the space consumed by the circuit components. The ongoing evolution in miniaturizing IC components has resulted in reduced costs and more circuit functionality for a given substrate size and manufacturing cost. For example, only a few years ago spacing between adjoining circuit elements in a typical IC was in the neighborhood of two to three microns. Today, many ICs are being designed at spacing distances as small as 0.35 microns or less. To accommodate narrower spacing, the electrical conductors are reduced in width. The reduction in width is compensated for by increasing the thickness of the conductors to avoid degrading the quality of the signal conducted. Metal conductors have also been substituted for polysilicon conductors, because the metal conductors provide better signal conducting capabilities.

Increasing the thickness of the conductors also requires increases in the thickness of the dielectric insulation material which separates and covers the conductors and components. The thickness of the dielectric must be greater than the height or topology difference among the components, to provide adequate insulation to separate the layers and components of the IC structure from one another. Increases in the thickness of the dielectric material are possible, in part, as a result of advanced planarization techniques such as chemical mechanical polishing (CMP). CMP smooths relatively significant variations in the height of the different components to a planar surface. Smoothing the variable-height topology to a planar surface allows the typical lithographic semiconductor fabrication techniques to be used to form considerably more layers than were previously possible in IC construction. Previously, only one or two layers were typically constructed before the topology variations created such significant depth of focus problems with lithographic processes that any further precision fabrication of layered elements was prevented. However, because of CMP, the number of layers of the IC is no longer limited by the topology. Some present ICs are formed by as many as five or more separate metal or interconnect layers, each of which is separated by a CMP planarized dielectric layer. Consequently, CMP has created the opportunity to incorporate more circuitry on a single substrate in a single IC.

It is with regard to these and other considerations and problems that the present invention has evolved.

SUMMARY OF THE INVENTION

The improvements of the present invention relate to electrically connecting and electrically isolating vertically extending metal circuit components with respect to horizontally extending electrical conductors located above and below the circuit component in such a way that the resulting electrical connection or isolation does not consume an excessive amount of space, that a high quality electrical connection or isolation is established, and that there is no degradation in the electrical performance of the component. Another improvement involves fabricating the electrical connection or isolation in a multiple layer, metal interconnect IC, using fabrication methods which are similar to those used in forming the conductors of the interconnect layers and without revising the basic process steps involved in fabricating the interconnect layers. Another improvement involves fabricating the electrical connection or isolation without requiring any additional lithographic patterning steps or different materials from those which would otherwise be used in fabricating the interconnect layers.

In accordance with these and other improvements, the method of electrically connecting and isolating a vertically oriented metal element comprises the steps of connecting a lower end of the metal element to a conductor of a lower interconnect layer at a lower end of an opening in an inter-layer dielectric, extending an upper end of the metal element beyond an upper surface of the inter-layer dielectric, chemical mechanical polishing the extending upper end down flush with the upper surface of the inter-layer dielectric, covering the flush upper end with dielectric material, and positioning the upper interconnect layer over the dielectric material covering the flush upper end. The chemical mechanical polishing used to produce the flush upper end allows the dielectric material covering to effectively and precisely isolate the upper end of the metal element from vertically adjoining and horizontally extending conductors. The electrical isolation occurs in a vertical sense and therefore consumes very little space. Similarly, the lower end of the vertical metal element is connected to a horizontal conductor in a relatively small amount of space.

Other preferable aspects of the method involve chemical mechanical polishing of the surface of the dielectric material. The chemical mechanical polishing forms precise surfaces upon which lithographic patterning can be effectively performed. In addition, chemical vapor deposition or physical vapor deposition may be used to form the metal element, its lower end connection and the coating of dielectric material. Chemical vapor deposition allows the components to be formed in vertical orientations in vertical openings and allows metal elements to be formed conjunctively with the conductors of the interconnect layers, thereby simplifying the fabrication process. More than one metal element may be formed in the opening and positioned adjacent to the coating of dielectric material, all in a self-aligning manner which further simplifies the construction and does not require large spaces to accomplish. Only a minimum number of lithographic patterning steps are required when using the self-aligning aspects of the invention. The minimum use of lithographic patterning steps decreases the possibilities for error and simplifies the process.

A more complete appreciation of the present invention and its scope may be obtained by reference to the accompanying drawings, which are briefly summarized below, and to the following detailed description of presently preferred embodiments of the invention, and to the appended claims.

DETAILED DESCRIPTION

Figure 1:
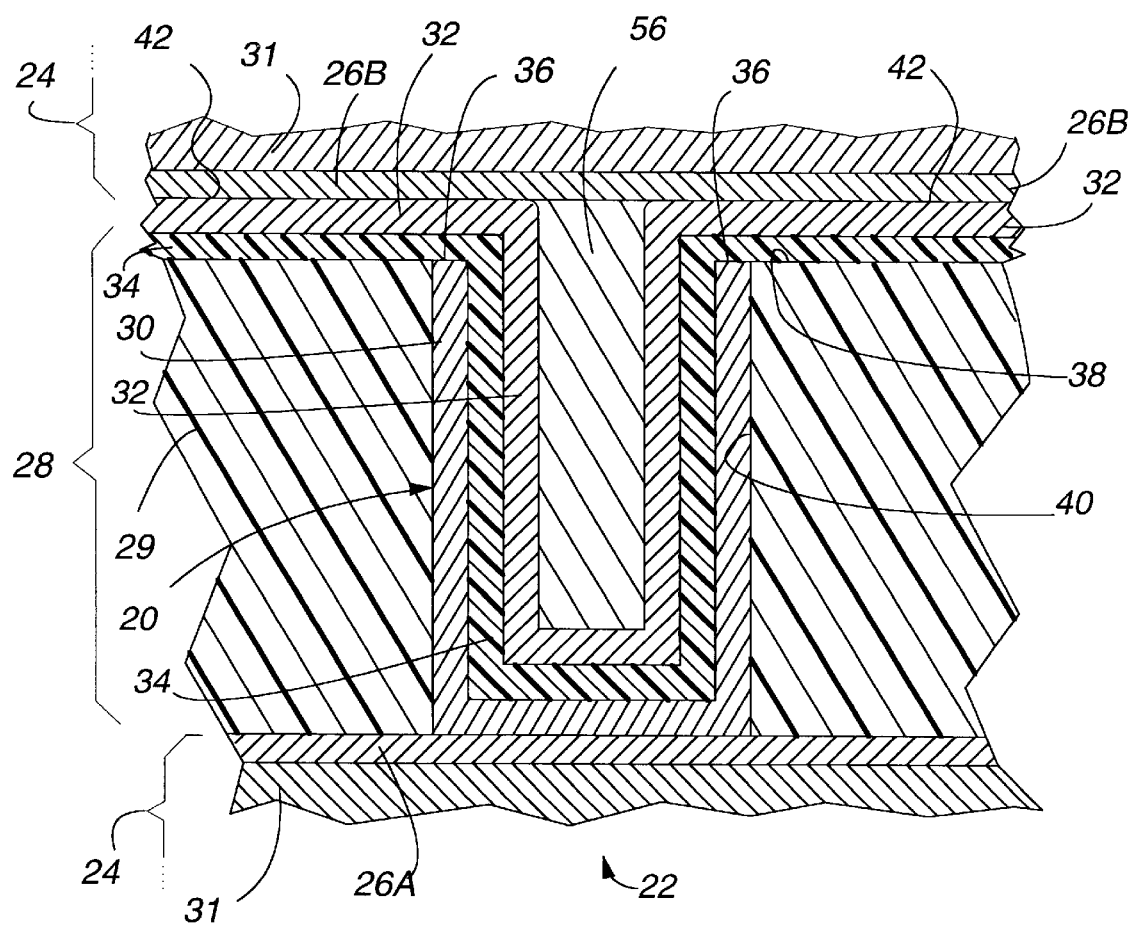
FIG. 1 is a cross-sectional view of a capacitor having vertical elements connected between multiple metal interconnect layers in an integrated circuit, which is fabricated in accordance with the process of the present invention.

The process steps of the present invention are described in connection with a capacitor 20 shown in FIG. 1. The capacitor 20 is one example of a circuit component of an integrated circuit (IC) 22 to which the present invention is applicable. The IC 22 is of the type having multiple layers 24 of electrical conductors known as interconnects. The conductors of each interconnect layer 24 establish connections to the functional components of the IC.

Typically, the conductors of the interconnect layer 24 will be formed of multiple layers of metals, illustrated by the layers 26A, 26B and 31. The layers 26A and 26B are preferably formed from titanium nitride or titanium and titanium nitride. The layer 31 may be formed from copper or aluminum or a combination of both, for example aluminum with approximately 0.5% copper. If the layer 31 is formed of primarily aluminum, an anti reflection coating (ARC) 26A is applied in the conventional manner to the aluminum to prevent light reflection into undesired locations within the photoresist material which is typically applied during photolithographic semiconductor fabrication processes. Further still, if the layer 31 is formed of primarily copper, the copper is typically coated with an encapsulating layer 26A to prevent the copper ions from migrating beyond the borders of the layer, as is conventional.

The conductors of each interconnect layer 24 are separated by a relatively thick layer 28 of inter-layer dielectric material 29. Because of the relative thickness of the inter-layer dielectric 29, space exists between interconnect layers 24 to accommodate the capacitor 20 or some other component of the IC.

The capacitor 20 illustrates the process steps of the present invention because, among other things, it incorporates a vertical metal capacitor plate 30 which is exemplary of a longitudinally extending (orthogonal to the view of FIG. 1) and vertically oriented metal element that is used in an IC and fabricated by the process of the present invention. The vertical orientation of the metal elements to which the present invention relates need not be precisely perpendicular to the horizontal.

The plates 30 and 32 are separated by dielectric material 34. Before the dielectric material 34 is placed between the plates 30 and 32, an upper end 36 of the plate 30 is chemical-mechanically polished to a coplanar surface level which is flush with an upper surface 38 of the adjoining inter-layer dielectric material 29.

The plates 30 and 32 extend between and are electrically connected to the conductor layers 26A and 26B, respectively, of the interconnect layers 24. The plates 30 and 32 are preferably formed of at least some of the metal material from which the conductor layers 26A and 26B are formed, for example titanium or titanium nitride. A lower end of the plate 30 (as shown) is directly electrically connected to the layer 26A of the lower interconnect layer 24, and an upper end of the plate 32 (as shown) is directly connected to the layer 26B of the upper interconnect layer 24. The electrical connections are preferably formed, in both cases, by the direct physical and electrical contact or integration of the layers 26A and 26B with the plates 30 and 32, respectively. The capacitor 20 extends through an opening 40 formed in the layer 28 of inter-layer dielectric material 29, in the manner shown in FIG. 1.

The conductors of the upper interconnect layer 24 (as shown) are formed on upper surfaces 42 of the metal material which forms the upper plate 32 and a metal capacitor plug 56 which is formed in a center opening of the U-shaped capacitor 20. The upper surfaces 42 of the structures 32 and 56 are chemical-mechanically polished to a smooth coplanar relationship to allow the conductor 26B of the upper interconnect layer 24 to be formed thereon by physical vapor deposition or chemical vapor deposition.

More details concerning the capacitor 20 and the IC 22 may be found in the previously mentioned, concurrently filed patent application. Details concerning the process steps of the present invention are described below in sequence in conjunction with FIGS. 2–11.

Figure 2:
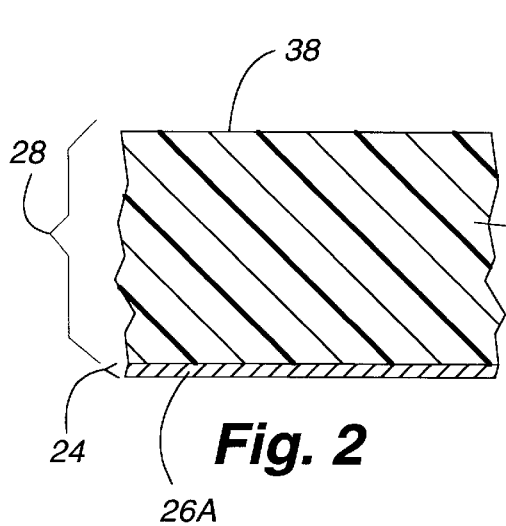
FIGS. 2–11 are cross-sectional views showing the sequence of steps involved in manufacturing the capacitor shown in FIG. 1, and illustrating the process steps according to the present invention.

The process steps begin at the stage shown in FIG. 2 where the conductors of the lower interconnect layer 24 (represented by layer 26A) have been covered with the layer 28 of inter-layer dielectric material 29. The first process step is to form the opening 40 (FIGS. 1 and 4) in the dielectric material in which the elongated metal element (e.g., a capacitor plate 30, FIG. 1) will be positioned and formed.

Figure 3:
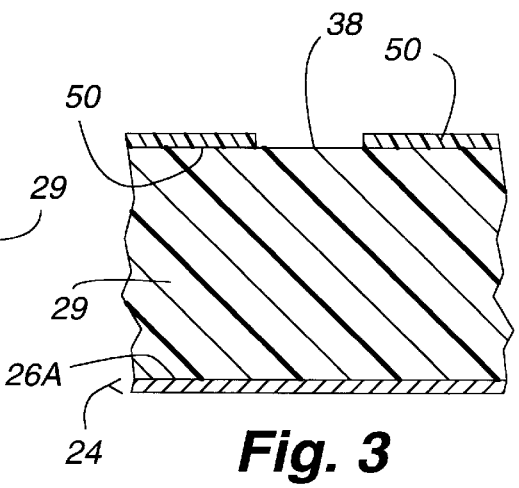

The opening 40 in the inter-layer dielectric 29 is preferably formed by conventional lithographic steps illustrated in part in FIG. 3. A layer of conventional photoresist material 50 is placed over the upper surface 38 of the inter-layer dielectric material 29. A mask (not shown) is positioned above the photoresist material 50 by conventional IC processing equipment. The mask includes an open area (also not shown) which defines the size and location of the surface area of the opening 40 (FIGS. 1 and 4) to be formed in the inter-layer dielectric 29. Light is projected through the open area of the mask onto the layer of photoresist material 50, exposing the photoresist material beneath the open area of the mask. The exposed photoresist material 50 is thereafter removed by conventional washing techniques, exposing the upper surface 38 of the inter-layer dielectric 29 at the location where the opening is to be formed. The adjacent photoresist material 50 which has not been exposed is cured and remains temporarily in place.

Figure 4:
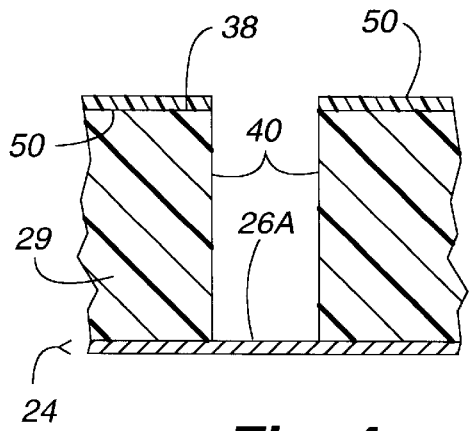

The opening 40 in the inter-layer dielectric 29 is formed by a conventional etching process, using the adjacent cured photoresist material 50 as a barrier, as is understood from FIG. 4. Preferably the etching is accomplished by a conventional reactive ion etching process or a plasma etching process. The etching proceeds very directionally without isotropic deviation. The opening 40 extends downward from the upper surface 38 to the electrical conductor layer 26A of the lower interconnect layer 24. The conductor layer 26A is exposed at the lower end of the opening 40. After the opening 40 has been completed as shown in FIG. 4, the cured photoresist material 50 is removed from the upper surface 38 of the inter-layer dielectric 29 by a conventional removal process.

Figure 5:
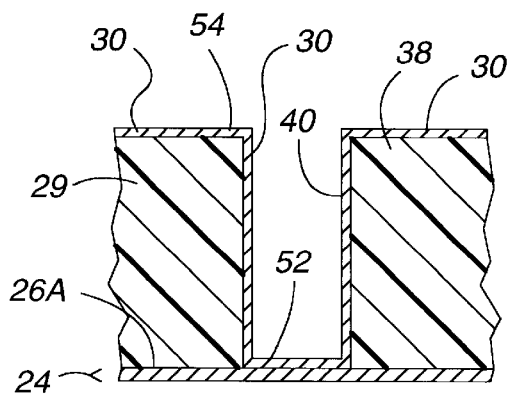

The elongated metal element, e.g. the capacitor plate 30, is next formed in the opening 40, as is shown in FIG. 5. The metal element is preferably formed by chemical vapor deposition or physical vapor deposition of metal onto the side walls of the opening 40 and onto the conductor layer 26A of the lower interconnect layer 24 at the lower end of the opening 40. In the example of the capacitor plate 30, the metal is deposited over both side walls of the opening 40. A lower end 52 of the metal element directly physically contacts the conductor layer 26A.

Preferably, the metal from which the metal element (e.g., plate 30) is formed is of at least some of the same type of metals from which the conductors of the lower interconnect layer 24 are formed, thereby establishing a sound electrical contact and connection. Forming the metal element (e.g., plate 30) with the same process and substance as the layer 26A of the interconnect layers 24 greatly simplifies the process because no different process steps are required beyond those necessary to form the conductor layer 26A. Thus, no additional complexity in the IC fabrication process is introduced. The reliability of the IC fabrication process is also preserved because of the fewer number of separate processing steps which must be accomplished. However, if desired or for specific purposes, the metal from which the element (e.g., plate 30) is formed may be different from the metal(s) of the conductor layers 26A and 26B of the interconnect layers 24.

Figure 6:
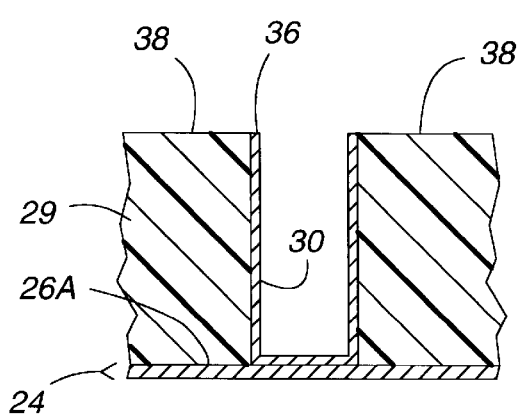

An upper end 54 of the metal element (e.g., plate 30) initially extends out of the hole 40 and onto the upper surface 38 of the inter-layer dielectric material 29, as shown in FIG. 5. However, as is shown in FIG. 6, the extending upper end 54 is reduced to a flush upper end 36 which is coplanar with the upper surface 38 of the dielectric 29. Chemical mechanical polishing is employed to reduce the extending upper end 54 (FIG. 5) to the flush upper end 36 (FIG. 6).

Figures 7, 8:
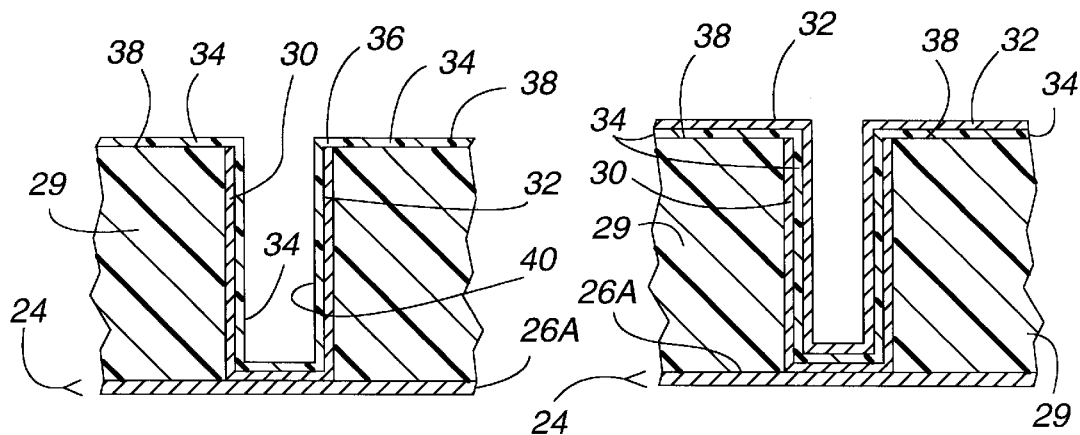

Next as shown in FIG. 7, the dielectric material 34 is deposited over the upper flush end 36 of the metal element (e.g., plate 30), over the inside surfaces of the U-shaped plate 30 and on the upper surface 38 of the dielectric material 29. The dielectric material 34 completely insulates the previously exposed surfaces of the plate 30. Preferably, chemical vapor deposition is used to form the dielectric material 34. The dielectric material 34 is deposited directly on the exposed surfaces of the plate 30 and covers over the flush upper end 36 of the plate 30. Using these surfaces upon which to deposit the dielectric material 34 simplifies the process, because other processing steps are not required to isolate or expose these surfaces. The chemical vapor deposition of the dielectric material 34 is self-aligning, which simplifies the fabrication process.

A second metal element (e.g., plate 32) is next formed on top of the dielectric material 34, as is shown in FIG. 8. The plate 32 is also formed by chemical vapor deposition or physical vapor deposition. The exposed surfaces of the dielectric material 34 are used as a self-aligning surface for the deposition of the metal of the plate 32.

In the context of the capacitor 20 (FIG. 1), the dielectric material 34 completely separates the plates 30 and 32. Because the flush end 36 of the plate 30 has been chemical-mechanically polished to a flush, coplanar level with the upper surface 38 of the dielectric 29, as shown in FIG. 6, and because the dielectric material 34 is uniformly deposited by chemical vapor deposition, the dielectric material 34 between the flush upper end 36 and the plate 32 is of a precise thickness, resulting in a very accurate dielectric insulating or isolating capability. If chemical mechanical polishing were not employed, the upper end 36 of the plate 30 might not be uniformly positioned, resulting in a weakened or reduced area of dielectric material between the capacitor plates 30 and 32 at the end 36, thereby degrading the performance of the capacitor and/or the insulating capability of the dielectric material 34. A similar degradation in performance of other circuit components could also occur in other similar circumstances.

Figures 9, 10:
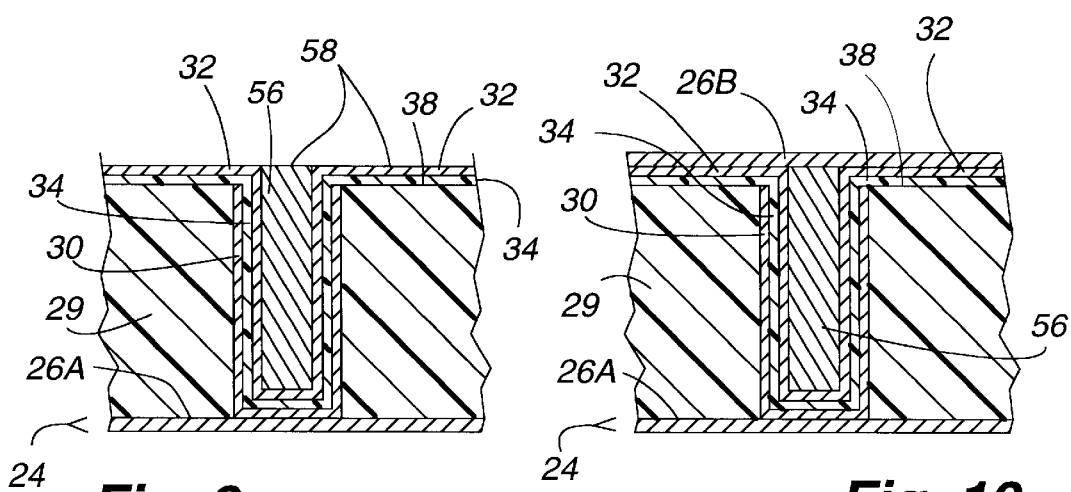

After the second metal element (e.g., plate 32) is formed, a plug 56 of metal is formed in the center opening formed by the U-shaped plate 32, as shown in FIG. 9. The insertion of the plug 56 in the center opening is an optional step. Thereafter, an upper surface 58 of the plug 56 and the horizontal portions of the metal forming the capacitor plate 32 are chemical-mechanically polished to a coplanar surface. The chemical mechanical polishing assures a planar surface upon which the layer 26B of the upper interconnect layer 24 (as shown) is deposited, as shown in FIG. 10.

The layer 26B, or its functional equivalent, is additionally employed as a "glue" layer to assure a good mechanical connection to the component to which it is attached. The use of "glue" layers is well known in semiconductor fabrication processes.

Figure 11:
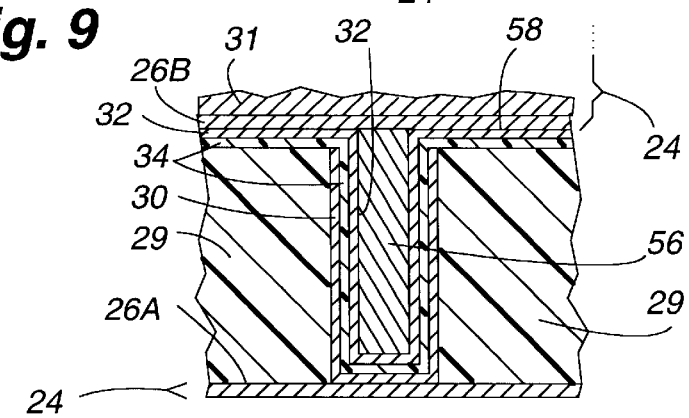

Thereafter, as shown in FIG. 11, the additional layer 31 of the conductors of the upper interconnect layer 24 is formed on the top surface of the layer 26B. Additional layers (not shown) may be formed until conductors of the upper interconnect layer 24 are completed. Preferably the conductors of the upper interconnect layer 24 are formed by chemical vapor deposition or physical vapor deposition and patterning by conventional lithography.

As is apparent from the process described above, the chemical mechanical polishing allows the upper surfaces to be precisely aligned in such a manner that larger surface areas are not required to make effective electrical connections to the conductors of the interconnect layers. Instead, the metal elements may be directly connected to the interconnect conductors, or may be formed simultaneously and integrally with the interconnect conductors. Consequently, valuable space on the IC is not consumed by excessively large electrical connections. Furthermore, the precise spacing available from chemical mechanical polishing allows the metal elements to be precisely separated and isolated from adjoining metal elements. The operational performance of the components of which the metal elements are a part is thereby preserved and enhanced. Further still, these advantages are accomplished by using essentially the same conventional types of fabrication steps which are already needed to complete the IC, thereby not increasing the complexity of the process or introducing additional variables into the process which might be a source of problems or reduced yields. The manner in which the metal element is extended between and connected to the interconnect layer conductors is accomplished in an advantageous self-aligning procedure by using the other elements as surfaces upon which to form additional elements. These self-aligning aspects result in accomplishing the process of the present invention using only a minimum number of lithographic patterning steps. Many other advantages and improvements will be apparent upon complete comprehension of the aspects and ramifications of the present invention.

Presently, preferred embodiments of the new and improved capacitor of the present invention have been shown and described with a degree of particularity. These descriptions are of preferred examples of the invention. In distinction to its preferred examples, it should be understood that the scope of the present invention is defined by the following claims the scope of which should not necessarily be limited to the detailed description of the preferred embodiments set forth above.

The invention claimed is:

1. A method of forming and electrically connecting an elongated vertically oriented trench capacitor having metal upper and lower capacitor plates extending in an opening through an inter-layer dielectric positioned between a lower generally-planar interconnect layer of conductors and an upper generally-planar interconnect layer of conductors in an IC having a substrate, the lower interconnect layer separated from the substrate by a layer of dielectric material, comprising the steps of:

connecting a lower end of the lower capacitor plate to a conductor of the lower interconnect layer at a lower end of the opening;

extending an upper end of the lower capacitor plate beyond an upper surface of the inter-layer dielectric;

chemical mechanical polishing the extending upper end down flush with the upper surface of the inter-layer dielectric;

covering the flush upper end with dielectric material;

forming the upper capacitor plate on top of the dielectric material covering the flush upper end;

chemical mechanical polishing an upper surface of the upper capacitor plate to a planar surface; and forming at least one electrical conductor of the upper interconnect layer in contact with the planar upper surface of the upper capacitor plate.

2. A method as defined in claim 1 further comprising the step of:

covering a vertical portion of the lower capacitor plate within the opening which extends between the upper and lower ends of the lower capacitor plate with dielectric material simultaneously with covering the flush upper end with dielectric material.

3. A method as defined in claim 2 further comprising the step of:

covering the connection of the lower end to the conductor at a lower end of the opening with dielectric material simultaneously with covering the vertical portion and the flush upper end of the lower capacitor plate with dielectric material.

4. A method as defined in claim 3 further comprising the steps of:

extending the upper capacitor plate into the opening;

positioning a lower end of the upper capacitor plate adjacent to the dielectric material at the lower end of the opening; and connecting an upper end of the upper capacitor plate to an electrical conductor of the upper interconnect layer.

5. A method as defined in claim 1 further comprising the step of:

forming the lower capacitor plate within the opening.

6. A method as defined in claim 5 further comprising the step of:

simultaneously forming the lower capacitor plate, the connection of the lower end of the lower capacitor plate to the lower interconnect layer and the extension of the upper end of the lower capacitor plate above the upper surface of the inter-layer dielectric.

7. A method as defined in claim 6 further comprising the step of:

forming the lower capacitor plate, the connection of the lower end of the lower capacitor plate to the conductor of the lower interconnect and the extension of the upper end of the lower capacitor plate from essentially the same metal as the metal from which the conductors of the interconnect layers are formed.

8. A method as defined in claim 6 further comprising the step of:

simultaneously forming the lower capacitor plate, the connection of the lower end of the lower capacitor plate to the conductor of the lower interconnect and the extension of the upper end of the lower capacitor plate by one of chemical vapor or physical vapor deposition.

9. A method as defined in claim 8 further comprising the step of:

forming the lower capacitor plate by one of chemical vapor or physical vapor deposition of metal on a side wall of the opening.

10. A method as defined in claim 9, wherein the lower capacitor plate defines a vertical trench in the opening, further comprising the step of:

simultaneously covering a vertical trench sidewall portion of the lower capacitor plate between the upper and lower ends and the flush upper end with dielectric material; and depositing the dielectric material over the vertical trench sidewall portion and the flush upper end of the lower capacitor plate.

11. A method as defined in claim 10, wherein the dielectric material defines a vertical trench in the opening, further comprising the steps of:

forming the upper capacitor plate in the dielectric material trench with a lower end of the upper capacitor plate located adjacent to the dielectric material at a lower end of the dielectric material trench; and depositing the metal of the upper capacitor plate over a vertical trench sidewall portion of the dielectric material trench by one of chemical or physical vapor deposition.

12. A method as defined in claim 11 further comprising the steps of:

forming the opening in the inter-layer dielectric by lithographically patterning a layer of photoresist placed on the inter-layer dielectric material;

eliminating the photoresist at a location where the opening is to be formed into the inter-layer dielectric; and etching the opening into the inter-layer dielectric using the remaining photoresist as a barrier to etching in locations other than at the opening.

13. A method as defined in claim 12 further comprising the step of:

connecting the lower and upper capacitor plates to the conductors of the lower and upper interconnect layers respectively, without lithographically patterning the connection.

14. A method as defined in claim 12 further comprising the step of:

etching the opening substantially only vertically without substantial isotropic deviation.

15. A method as defined in claim 14 further comprising the step of:

etching the opening by one of either reactive ion etching or plasma etching.

16. A method as defined in claim 1 further comprising the steps of:

forming the lower capacitor plate, the connection of the lower end of the lower capacitor plate to the conductor of the lower interconnect and the extension of the upper end of the lower capacitor plate from essentially the same metal as a metal from which the conductors of the interconnect layers are formed.

17. A method as defined in claim 16 further comprising the step of:

depositing the lower capacitor plate, the connection of the lower end of the lower capacitor plate to the conductor of the lower interconnect and the extension of the upper end of the lower capacitor plate.

18. A method as defined in claim 1 wherein the step of forming at least one electrical conductor of the upper interconnect layer comprises the step of:

depositing metal on the planar upper surface of the upper capacitor plate.

19. A method as defined in claim 18 wherein the step of depositing metal on the planar upper surface of the upper capacitor plate comprises the step of:

depositing the metal by one of chemical vapor deposition or physical vapor deposition.

* * * * *